United States Patent [19]

Kajii

[11] Patent Number: 5,051,626
[45] Date of Patent: Sep. 24, 1991

[54] BUFFER CIRCUIT FOR LOGIC LEVEL CONVERSION

[75] Inventor: Kiyoshi Kajii, Atsugi, Japan

[73] Assignee: Fujitsu Limited, Kawasaki, Japan

[21] Appl. No.: 610,461

[22] Filed: Nov. 9, 1990

Related U.S. Application Data

[63] Continuation of Ser. No. 397,833, Aug. 24, 1989, abandoned.

[30] Foreign Application Priority Data

Aug. 30, 1988 [JP] Japan ............... 63-216732

[51] Int. Cl.$^5$ ........................ H03K 19/0175
[52] U.S. Cl. ............... 307/475; 307/443; 307/450; 307/542; 307/572; 307/574
[58] Field of Search ............ 307/443, 450, 475, 572, 307/574, 542

[56] References Cited

U.S. PATENT DOCUMENTS 4,767,951  8/1988  Cornish et al. ............ 307/475
4,791,322  12/1988  Graham et al. ............ 307/450

FOREIGN PATENT DOCUMENTS 55-50743  4/1980  Japan .

OTHER PUBLICATIONS

Laude, D. P., "An ECL Compatible GaAs 504 4-Input Nor Gate Array", Proceedings of the IEEE 1986 Custom Integrated Circuits Conference, May 12-15, 1986, pp. 508-512.

Primary Examiner—Stanley D. Miller
Assistant Examiner—Margaret Rose Wambach
Attorney, Agent, or Firm—Staas & Halsey

[57] ABSTRACT

An input buffer circuit for converting a logic level of an input logic signal comprises an inversion circuit and a level shift circuit in which the inversion circuit comprises an input terminal to which the input signal is applied, a first voltage source for supplying a first predetermined voltage, a second voltage source for supplying a second predetermined voltage having a level lower than that of the first predetermined voltage, a first resistor circuit having a first end connected to the first voltage source, a first enhancement type field effect transistor having a drain connected to a second end of the first resistor circuit, a source connected to the second voltage source and a gate connected to the input terminal, a second resistor circuit having a first end connected to the first voltage source, and a second enhancement type field effect transistor having a drain connected to a second end of the second resistor circuit, a source connected to the drain of the first enhancement type field effect transistor and a gate connected to the gate of the first enhancement type field effect transistor.

7 Claims, 13 Drawing Sheets

BUFFER CIRCUIT FOR LOGIC LEVEL CONVERSION

This is a continuation of copending application Ser. No. 07/397,833 filed on Aug. 24, 1989, now abandoned.

BACKGROUND OF THE INVENTION

The present invention generally relates to buffer circuits, and more particularly to an input buffer circuit for converting a logic level of an input signal having an ECL (emitter-coupled-logic) level to a signal having a logic level suitable for use in a compound semiconductor integrated circuit.

There are various semiconductor devices such as bipolar ECL devices, n-MOS (metal-oxide-semiconductor) devices, GaAs MESFET (gallium arsenide metal-semiconductor field effect transistor) devices, HEMT (high electron mobility transistor) devices and the like that are used in high speed logic integrated circuits. Among others, silicon-based bipolar ECL devices are used most commonly.

Generally, the logic level (voltage level) used in the silicon-based ECL device, called the ECL level, is different from the logic level used in the compound semiconductor devices such as GaAs MESFET or HEMT. Therefore, there is a need to achieve compatibility between the logic levels when devices of different types are used in a same system.

For example, when a part of a high speed arithmetic unit using ECL devices is to be replaced by MESFET or HEMT devices, an input/output buffer circuit is needed for achieving compatibility between the ECL device and the other devices. Such an input/output buffer circuit is required to have a characteristic which is stable against variation of the characteristics of the semiconductor devices used therein.

There are a number of designs for high speed logic gates of GaAs integrated circuits that are developed so as to meet various requirements such as low electrical power, short delay time, large scale of integration, appropriate source voltage level, appropriate logic amplitude, high operational frequency, easy manufacturing process, high yield, and the like. From the view point of large scale integration and low power consumption, integrated circuits of FET devices are preferred and various devices such as HEMT or GaAs MESFET are studied intensively.

While there are various designs for the logic circuit based on the FET of GaAs or other compound semiconductor integrated circuits, a DCFL (direct coupled FET logic) device comprising an enhancement type FET and a depletion type FET acting as a load of the enhancement type FET is particularly preferred from the view point of integration density, simple construction, small size, low power consumption, high operational speed and the like. Thus, the DCFL device is expected to play a major role in the logic gates of the future LSI (large scale integrated circuit) or VLSI (very large scale integrated circuit) devices.

As already noted, there is a need to provide an input buffer circuit to achieve compatibility of the logic level of the signals when the DCFL or other compound semiconductor device is used in combination with the ECL device.

Conventionally three types of input buffer circuits are known for achieving compatibility between the ECL device and the DCFL device.

Referring to FIGS. 1 and 2 at first, the first type of the prior art input buffer circuit uses two depletion type FETs and an inverter circuit in combination for producing a signal to be supplied to the following circuit which may be the DCFL device. As shown in FIG. 1, the buffer circuit represented by a circuit 1 comprises a level shift circuit 2 and an inverter 3. The level shift circuit 2 comprises a pair of depletion type FETs 4 and 5 connected in series, in which a source of the FET 4 is connected to a drain of the FET 5, a gate and a source of the FET 5 are connected each other, and a drain of the FET 4 is connected to the ground. The source of the FET 5 is further connected to a constant voltage source supplying a source voltage of −3.6 volts. The inverter 3, on the other hand, comprises a depletion type FET 6 and an enhancement type FET 7 connected in series, wherein a source of the FET 6 is connected to a drain of the FET 7, a drain of the FET 6 is connected to the ground, and a source of the FET 7 is connected to a constant voltage source supplying a source voltage of −2 volts. Further, the source of the FET 4 is connected to a gate of the FET 7. Thus, the level shift circuit 2 shifts the level of an input signal having the ECL level applied to a gate of the FET 4 and a signal having a level adapted to the following circuit is produced after inversion in the inverter 3. In this circuit 1, one can change the amount of shift by choosing a gate width of the FETs 4 and 5. Further, one can obtain a buffering operation by setting the gate width of the FETs 6 and 7 properly so that the current flowing through these FETs is increased.

This prior art buffer circuit 1, however, has the following problems.

1) Change of transfer characteristic caused by variation of threshold voltage in the depletion type FET As the level shift circuit 2 is constructed by two FETs 4 and 5, there appears a change in the transfer characteristic of the buffer circuit 1 when the threshold voltage of the FETs 4 and 5 is varied. For example, when the threshold voltage of the FETs 4 and 5 is varied in the circuit of FIG. 1 where the source of the FET 4 is connected to the source voltage of −3.6 volts via the FET 5 having the gate and the source connected and acting as a constant current source, a voltage $V_{SG}$ appearing across the source and gate of the FET 4 is changed. Further, when the threshold voltage of the FET 6 is varied, the operational characteristic of the inverter 3 is also changed. Unfortunately, the variation of the threshold voltage is relatively common in the current compound semiconductor FETs. Such a variation is caused also as a result of the side gate effect which will be described later.

FIG. 2 shows such a change of the transfer characteristic of the buffer circuit 1. Referring to FIG. 2, the abscissa represents an input voltage $V_{in}$ applied to the gate of the FET 4 and the ordinate represents an output voltage $V_{out}$ obtained from the drain of the FET 7 for a case in which the threshold voltage of the enhancement type FET 7, designated as $V_{TE}$, is fixed at 0.25 volts and the threshold voltage of the depletion type FETs 4, 5 and 6, designated as $V_{TD}$, is changed from −0.3 volts to −0.8 volts with an interval of 0.1 volts. As is clear from the drawing, the buffer circuit 1 has a transfer characteristic which is extremely sensitive to the variation in the threshold voltage of the depletion type FET 7.

2) Side gate effect

In the buffer circuit of FIG. 1 using −3.6 volts for the source voltage of the level shift circuit 2, there appears a side gate effect which modifies the threshold voltage of the FET 4 as will be explained. Responsive thereto, the transfer characteristic of the circuit is shifted from the designed or desired characteristic.

Next, the side gate effect will be explained with reference to FIG. 3 showing a schematic structure of the depletion type FET 4. Note that the FET 4 is a HEMT device. Referring to FIG. 3, the FET 4 is constructed on a GaAs substrate 11 and comprises a GaAs epitaxial layer 12 having a predetermined layered structure grown epitaxially on the GaAs substrate 11, an AlGaAs (aluminium gallium arsenide) epitaxial layer 12' further grown epitaxially on the layer 12, a source electrode 13, a gate electrode 14 and a drain electrode 15 each provided on the layer 12', an isolation structure 16 formed in the layer 12, and an electrode 17 also on the layer 12' for application of the voltage of −3.6 volts.

In such a structure, the electrical field created by the electrode 17 extends beyond the isolation structure 16 to a region under the gate electrode 14 particularly when the magnitude of the voltage applied to the electrode 17 is large such as −3.6 volts, and responsive thereto, the electrical potential in the region under the gate electrode 14 is changed which in turn causes a modification of the threshold level $V_{th}$ of the FET 4. Such an effect is known as the side gate effect. It is said that such a change of the electrical potential is caused by electrons trapped in the surface state which in turn is developed at a boundary between the GaAs substrate 11 and the epitaxial layer 12'.

The side gate effect can be observed most clearly in a plot of the square root of the source-drain current versus the source-drain voltage shown in FIG. 4. In this plot, the current flowing through the FET 4 with a so-called square root-law extends generally straight with the source-gate voltage $V_{SG}$ and has an intercept at the abscissa indicative of the threshold voltage $V_{th}$ of the FET. When there appears the side gate effect, the characteristic curve is shifted as shown in the drawing, and together with this, the threshold voltage $V_{th}$ is changed to $V_{th}+\Delta V$. As a result, the operational characteristic of the buffer circuit 1 is significantly affected. This side gate effect arises as a result of the use of a large source voltage (−3.6 volts) as already noted. If one could increase a distance L between the electrode 17 and the gate 14, the side gate effect is of course reduced. However, such a measure is contradictory to the requirement to increase the integration density and hence the operational speed of the device. Thus, the side gate effect has been a serious problem in the integrated circuit of compound semiconductor devices such as HEMT.

Accordingly, to correct for the side gate effect, there has been proposed a buffer circuit, shown in FIG. 5, in which the use of the source voltage of −3.6 volts is eliminated. The buffer circuit of FIG. 5 also is the subject of Japanese Patent Application No. 63-136774 filed June 3, 1988 and the corresponding Laid-Open Patent Application No. 01-3057221, laid open on Dec. 11, 1989, commonly assigned to the assignee of the present invention and application. Referring to FIG. 5, the buffer circuit is represented by a reference numeral 21 and comprises an inverter 22 for inverting an input signal supplied thereto and a level shift (level conversion) circuit 23 for shifting an output level of the inverter 22. The inverter 22 comprises depletion type FETs 24–26 and enhancement type FETs 27 and 28 wherein each of the FETs 24–26 has a gate and drain connected each other and all the FETs 24–27 are connected in series. Further, the FET 27 has a source connected to a gate of the FET 28 and also a drain connected to a drain of the FET 28. Note that FETs 27 and 28 form a Darlington pair. The level shift circuit 23, on the other hand, comprises a series connection of an enhancement type FET 29 and a depletion type FET 30, wherein the FET 30 has a source and a gate connected to each other. Further, the drain of the FET 24 is connected to the ground, a drain of the FET 29 also is connected to the ground, a source of the FET 28 is connected to a constant voltage source supplying a source voltage of −2 volt, and the source of the FET 30 connected to the constant voltage source.

When an input voltage having a level higher than the threshold level of the FET 27 is applied to the gate of the FET 27, the FET 27 is turned on and a finite voltage is applied to the gate of the FET 28. When the voltage exceeds the threshold voltage of the FET 28, the FET 28 is turned on. Thus, the inversion function of the inverter 22 is basically determined by the sum of the threshold voltages of the FETs 27 and 28.

Next, elimination of the aforementioned problems pertinent to the circuit of FIG. 1 according to this proposed circuit will be described with reference to FIGS. 6(A) and (B) as well as FIGS. 7(A) and (B).

FIG. 6(A) shows a depletion type FET 31 having a gate and source connected each other. When a FET is connected as such, the FET exhibits a voltage versus current characteristic shown in FIG. 6(B) wherein the ordinate represents a source-drain current $I_{SD}$ and the abscissa represents a source-drain voltage $V_{SD}$. As can be seen in FIG. 6(B), there is an extensive saturated region where the current $I_{SD}$ remains substantially the same with an increase of the source-drain voltage $V_{SD}$. When there is a change in the threshold voltage in the FET 31 connected as shown in FIG. 6(A), the current level in the saturated region is changed as shown in FIG. 6(B). Thus, there is a substantial change of the current level responsive to the variation of the threshold level. This connection of the FET 31 is similar to the connection of the FET 5 described with reference to FIG. 1.

When the FET is connected as shown for the FET 32 of FIG. 7(A), on the other hand, such a change in the current level does not occur even when there is a variation in the threshold voltage of the FET 32. In the FET 32 connected as shown in FIG. 7(A), there holds a relationship between the drain voltage, gate voltage, source voltage and the threshold voltage defined as $$V_{GS} - V_{th} > V_{DS} \tag{1}$$

where $V_{GS}$ stands for a voltage across the gate and drain of the FET 32 and $V_{DS}$ stands for a voltage across the drain and source of the FET.

In the inequality (1), $V_{th}$ assumes a negative value and $V_{GS}$ and $V_{DS}$ assume an identical voltage level. Thus, the left hand side of the inequality is always larger than the term in the right hand side. This means that the depletion type FET 32 is operated in the unsaturated region and in such a case there holds a relation $$I_{SD} = 2K[(V_{GS} - V_{th}) - \tfrac{1}{2}V_{DS}]V_{DS} \qquad (2)$$
$$= 2K[\tfrac{1}{2}V_{DS} - V_{th}]V_{DS}$$
$$= K(V_{DS} - 2V_{th})V_{DS}$$

where $I_{SD}$ stands for the source-drain current of the FET 32 and K is a constant. FIG. 7(B) shows the characteristic defined by Eq.(2) graphically. It can be seen that the variation of the current $I_{SD}$ caused by the variation of the threshold voltage of the FET 32 is generally very small.

FIG. 8 shows a result of a simulation undertaken for the buffer circuit 21. Note that FIG. 8 shows the transfer characteristic. In the simulation, it was assumed that a threshold voltage $V_{TE}$ for the FETs 27, 28 and 29 is fixed at 0.25 volts and a threshold voltage $V_{TD}$ for the FETs 24–26 and 30 is changed from $-0.3$ volts to $-0.8$ volts with an 0.1 volt interval. As is clear from FIG. 8, the buffer circuit 21 is stable against change in the threshold voltage of the depletion FET. Further, the circuit is less sensitive to the side gate effect as the use of the source voltage of $-3.6$ volts which has been the cause of the side gate effect in the circuit of FIG. 1 is now eliminated by changing the source voltage to $-2$ volts.

This circuit 21, so far successful in eliminating the aforementioned problems, turned out to be unsatisfactory because of the following two problems.

Change of transfer characteristic caused by variation of the threshold voltage in the enhancement type FET As the FET 27 and the FET 28, both of the enhancement type, are connected as a Darlington pair, the effect of the threshold voltage of the enhancement type FET on the threshold characteristic of the inverter 22 and hence the buffer circuit 21 is doubled. FIG. 9 shows the transfer characteristic for the case of the circuit 21 wherein the threshold voltage $V_{TD}$ of the FETs 24–26 and 30 is fixed at $-0.5$ volts while the threshold voltage $V_{TE}$ of the FETs 27, 28 and 30 is changed from 0.15 volts to 0.3 volts with an interval of 0.05 volts. As can be seen from FIG. 9, the transfer characteristic of the buffer circuit 21 changes significantly with the variation of the threshold voltage.

2) Poor transient characteristic

In the circuit 21, the voltage level appearing at a node A of FIG. 5 is indefinite and the circuit 21 tends to exhibit instability in the operation. This leads to a poor transient characteristic.

Further, there is another buffer circuit 33 shown in FIG. 10. Referring to FIG. 10, the circuit 33 comprises a level shift part 34, another level shift part 35, differential part 36 and a reference part 37, in which the level shift parts 34 and 35 have a similar circuit construction as the level shift circuit 2 used in the buffer circuit of FIG. 1. Thus, the level shift part 34 comprises a pair of depletion type FETs 38 and 39 while the level shift part 35 comprises a pair of depletion type FETs 40 and 41. It should be noted that an input signal to the buffer circuit 33 is applied to a gate of the FET 38 and a reference voltage produced by the reference part 37 is applied to a gate of the FET 40. The differential part 36 comprises a pair of depletion type FETs 42 and 43, a pair of enhancement type FETs 44 and 45 respectively connected to the FETs 42 and 43 in series, and a depletion type FET 46 having a source and gate connected to each other, wherein the FET 44 and the FET 45 have respective sources connected in common to a drain of the FET 46. The FET 44 receives a signal subjected to level shifting from the level shift part 34 and the FET 45 receives a reference voltage also subjected to level shifting from the reference part 37 via the level shift part 35. This reference voltage supplied to the FET 45 is used as the logic threshold in the differential part 36.

The reference part 37 comprises depletion type FETs 47 and 48 in which the FETs 47 and 48 have respective gates and sources which are connected to each other. Further, a source voltage of $-3.6$ volts is supplied to the level shift parts 34 and 35 as well as to the differential part 36. The reference part 37 on the other hand receives a source voltage of $-2$ volts. Thus, this circuit has a problem in that the variation of the threshold voltage of the FETs causes a significant change in the transfer characteristic similarly to the case of the level shift circuit 2 in the buffer circuit of FIG. 1. Further, there is another problem in that the reference voltage produced by the reference part 37 changes in response to the variation in the threshold voltage of the FETs 47 and 48. Such a change in the reference voltage causes a change in the threshold operation of the differential circuit 36. Further, the circuit 33 suffers from the side gate effect as a result of the use of the source voltage which is set to $-3.6$ volts. According to the experiment, the buffer circuit 33 is more sensitive to the side gate effect than the buffer circuit 1.

SUMMARY OF THE INVENTION

Accordingly, it is a general object of the present invention to provide a novel and useful input buffer circuit wherein the aforementioned problems are eliminated.

Another and more specific object of the present invention is to provide an input buffer circuit wherein the side gate effect causing variation in the threshold voltage of field effect transistors is successfully eliminated.

Another object of the present invention is to provide an input buffer circuit wherein the effect of variation in the threshold voltage of field effect transistors on the transfer characteristic of the input buffer circuit is minimized.

Another object of the present invention is to provide an input buffer circuit having an excellent transient characteristic.

Another object of the present invention is to provide an input buffer circuit having a stable transient characteristic.

Another object of the present invention is to provide an input buffer circuit having a large operational margin.

Another object of the present invention is to provide an input buffer circuit which reduces the load on a driving circuit in a preceding stage used for driving the input buffer circuit.

Another object of the present invention is to provide a buffer circuit comprising an inversion circuit and a level shift circuit, wherein said inversion circuit comprises a first voltage source for supplying a first predetermined voltage, a second voltage source for supplying a second predetermined voltage which is lower than said first predetermined voltage, a first load resistance having a first end connected to the first voltage source, a first enhancement type field effect transistor having a source connected to a second end of the first load resistance and a drain connected to said second voltage source, said first enhancement type field effect transistor having a gate connected to an input terminal of the buffer circuit, a second load resistance having a first end connected to the first voltage source, a second enhancement type field effect transistor having a drain connected to a second end of the second load resistance, said second enhancement type field effect transistor having a source connected to the drain of said first enhancement type field effect transistor and a gate connected to the input terminal of the buffer circuit, and wherein said level shift circuit is connected to the drain of the second enhancement type field effect transistor. According to the present invention, the transfer characteristic of the buffer circuit does not change substantially even when there is a variation of the threshold voltage in the field effect transistors as the voltage drop caused across the source and drain of the first enhancement type field effect transistor compensates the variation of the threshold voltage either of the first and second enhancement type field effect transistors. Further, the buffer circuit of the present invention successfully eliminates the side gate effect by using the source voltage which has a small magnitude. Further, the buffer circuit has an excellent transient characteristic because of the elimination of a Darlington connection of the first and second enhancement type field effect transistors. Further, by providing a third depletion type field effect transistor having its gate connected to its source such that a drain thereof is connected to an input terminal of the buffer circuit and the source thereof is connected to the gate of the first enhancement type field effect transistor, excessive input current to the first enhancement type field effect transistor is suppressed and the low level state appearing in the transistor characteristic is shifted lower. Accordingly, the load viewed from succeeding circuits is reduced and the operational margin of the buffer circuit is increased. Further, by providing a capacitor across the drain and source of the third depletion type field effect transistor, an excellent transient characteristic can be achieved.

Other objects and further features of the present invention will become apparent from the following detailed description when read in conjunction with attached drawings.

DETAILED DESCRIPTION

Figure 1:
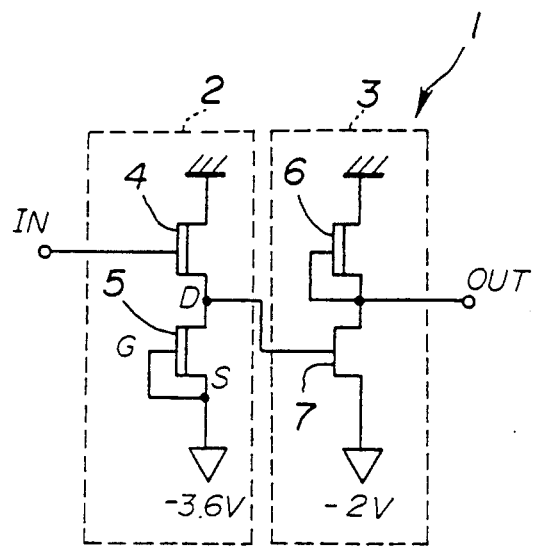
FIG. 1 is a circuit diagram showing a prior art input buffer circuit.
Figure 2:
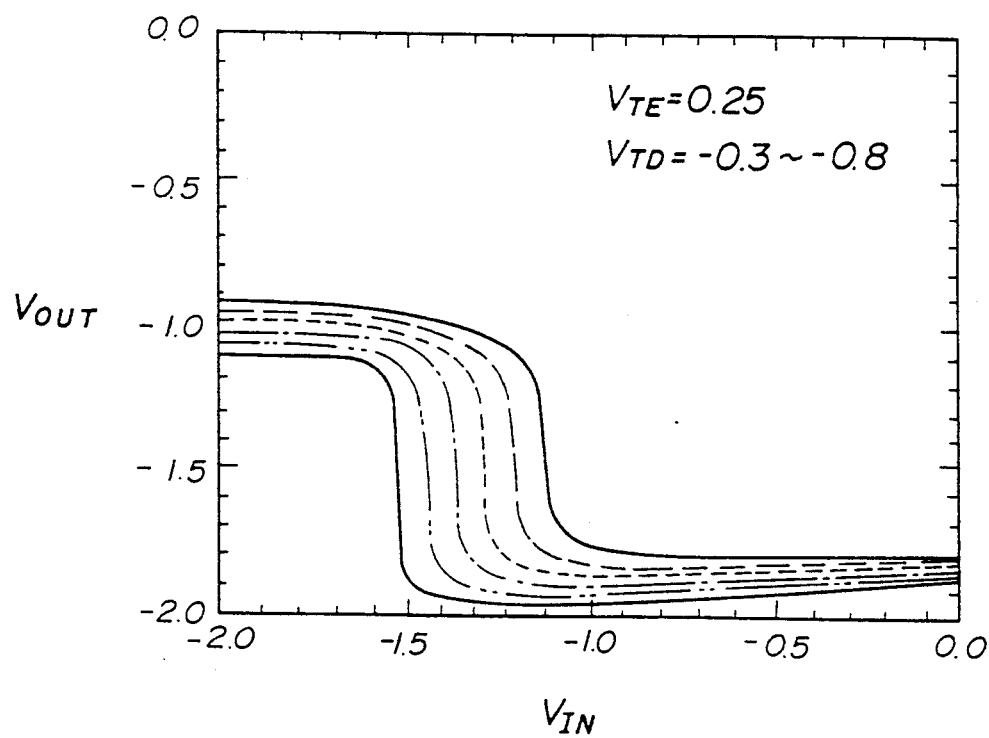
FIG. 2 is a diagram showing a transfer characteristic of the circuit of FIG. 1.
Figure 3:
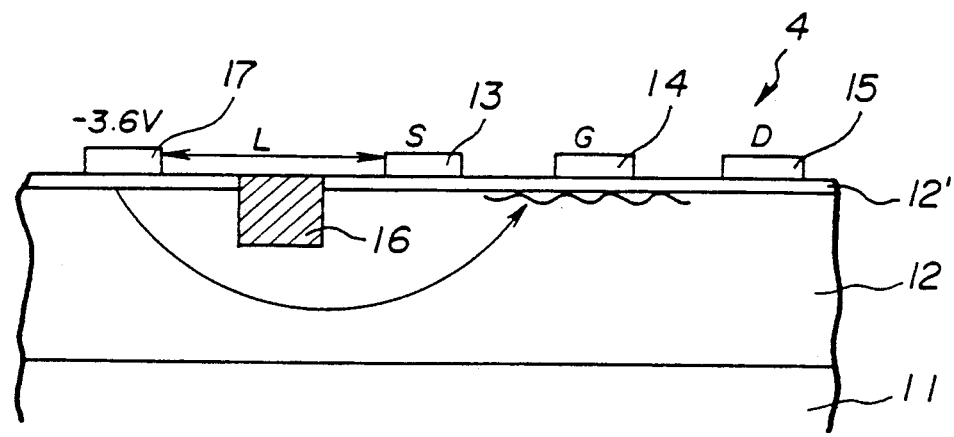
FIG. 3 is a diagram for explaining the side gate effect taking place in the circuit of FIG. 1.
Figure 4:
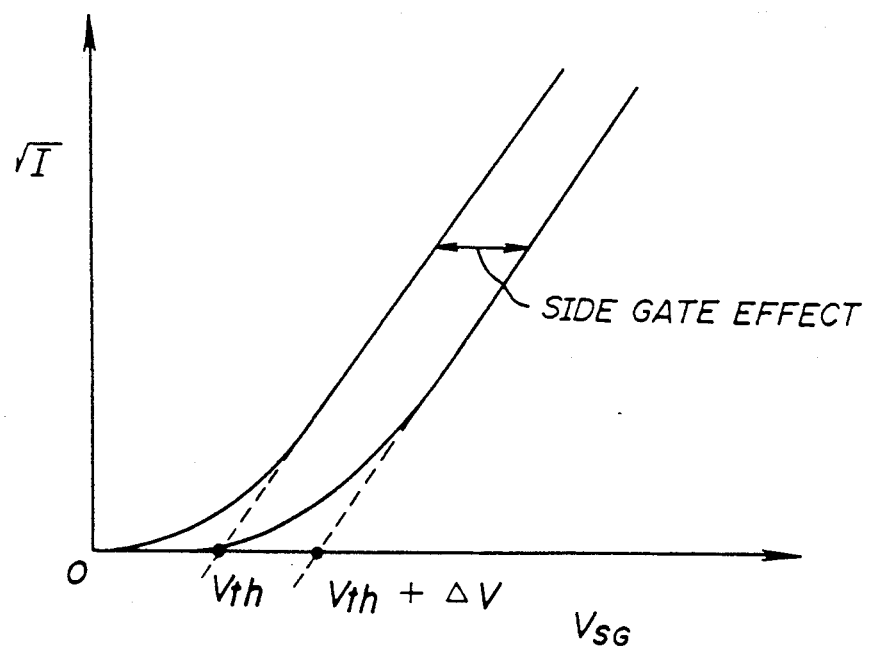
FIG. 4 is another diagram showing the side gate effect.
Figure 5:
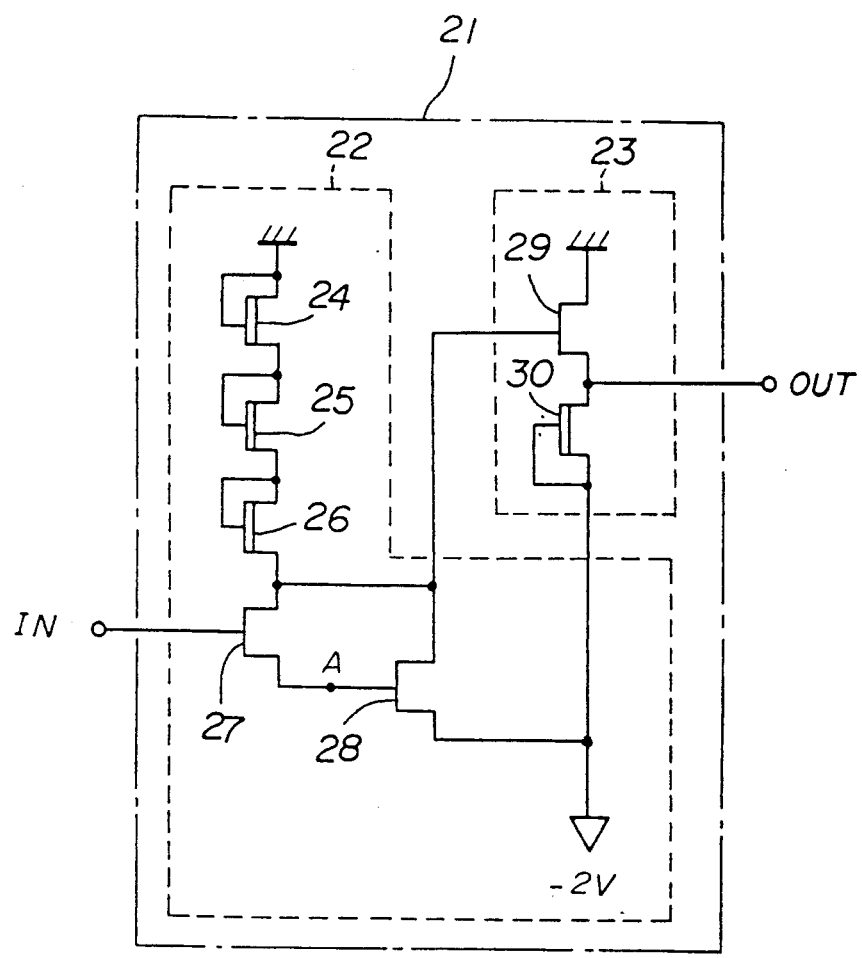
FIG. 5 is a circuit diagram showing a previously proposed input buffer circuit.
Figure 11:
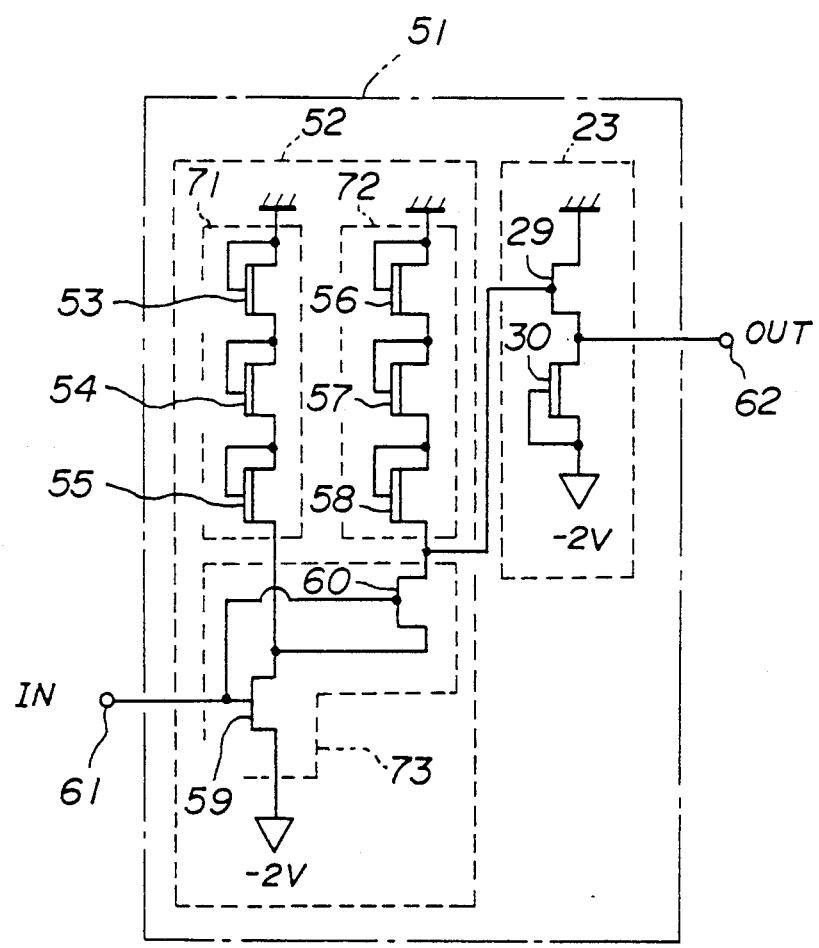
FIG. 11 is a circuit diagram showing a first embodiment of the input buffer circuit of the present invention.

Next, a first embodiment of the present invention will be described. Referring to FIG. 11, the input buffer circuit represented as a circuit 51 comprises an inverter 52 and a level shift circuit 23 constructed identically to the level shift circuit 23 already described with reference to FIG. 5. Thus, the level shift circuit of FIG. 11 likewise is designated as circuit 23 and the description thereof will not be repeated.

The inverter comprises depletion type field effect transistors 53-58 and a pair of enhancement type field effect transistors 59 and 60, wherein each of the transistors 53-58 has a gate connected to a drain of the same transistor. In the description hereinafter, the FETs 53-58 as well as the FETs 59 and 60 are assumed to be HEMT devices. However, the FETs are not so limited and other high speed devices such as GaAs MESFET can also be used. The FETs 53-55 are connected in series and the drain of the FET 53 is connected to the ground while a source of the transistor 55 is connected to a drain of the enhancement type FET 59. This FET 59 in turn has a source connected to a voltage source supplying a source voltage of −2 volts. Thus, the FETs 53-55 and the FET 59 are connected in series between the ground and the voltage source. The FET 59 has a gate connected to an input terminal 61 of the buffer circuit 51 and receives an input logic signal having the ECL level from the input terminal 61.

Similarly, the FETs 56–58 are connected in series wherein the drain of the FET 56 is connected to the ground and a source of the FET 58 is connected to a drain of the enhancement type FET 60. The FET 60 has a source connected to the drain of the FET 59 and a gate connected to the input terminal 61 commonly with the gate of the FET 59. The inverter 52 thus constructed supplies an output signal from the drain of the FET 60 to the level shift circuit 23 for level shifting, and a signal thus subjected to level shifting is supplied to the following stage (not shown) through an output terminal 62.

In the buffer circuit 51, a part of the circuit 51 including the FETs 53–55 designated by a reference numeral 71 and a part of the circuit including the FETs 56–58 designated by a reference numeral 72 respectively act as load to the FETs 59 and 60 whereby each of them has a construction to maintain the circuit characteristic unchanged against the variation of the threshold voltage of the FETs 53–55 or the FETs 56–58. Another part of the inverter 52 including the FETs 59 and 60 and designated by a reference numeral 73 is an essential part of the present invention and has a connection designed such that the variation of the threshold voltage in the FETs 59 and 60 does not cause any change in the logic threshold of the inverter 52 as will be described later. When the depletion type FETs used in the loads or circuit parts 71 and 72 are the Schottky gate FET type, it is preferred that loads 71 and 72 comprise three FETs connected in series as shown in FIG. 11. The input buffer circuit 51 has another feature in that the side gate effect is minimized by setting the source voltage to −2 volts.

Next, each of the circuit part will be described in detail.

Circuit Parts 71 and 72

Figure 7A:
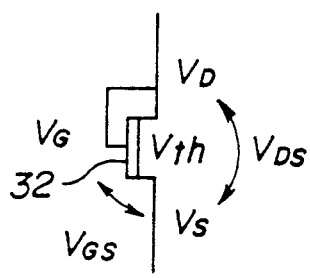
FIGS. 7(A) and (B) are diagrams showing a known connection of a depletion type field effect transistor with its drain and gate connected and the voltage versus current characteristic of the transistor thus connected.
Figure 7B:
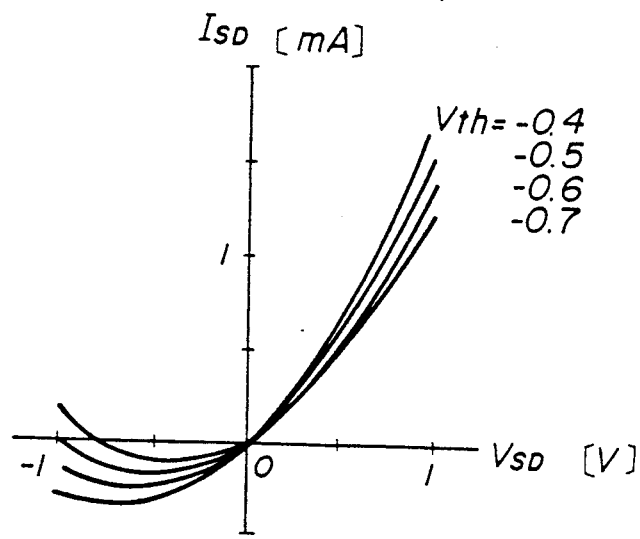

As already noted, each of the FETs 53–55 in the circuit part 71 or the FETs 56–58 in the circuit part 72 has the gate and drain connected together each other in. As a result of the connection, the FETs are operated in the linear region and the change of the operational characteristic of each of the FETs is minimized similarly to the FETs 24–26 shown in FIG. 5. The operational principle of the FETs having such a connection is already described with reference to FIG. 5 as well as FIGS. 7(A) and (B) and will not be repeated.

Figure 6A:
FIGS. 6(A) and (B) are diagrams showing a known connection of a depletion type field effect transistor with its source and gate connected and the voltage versus current characteristic of the transistor thus connected.
Figure 6B:
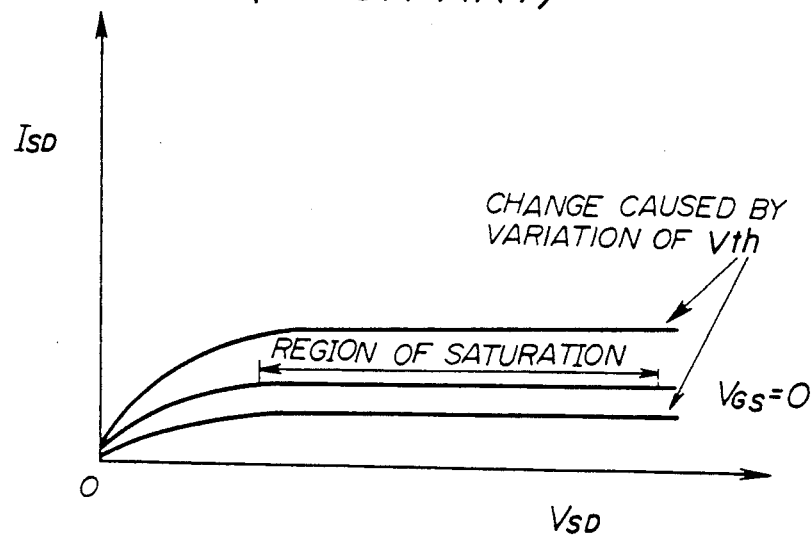
Figure 12:
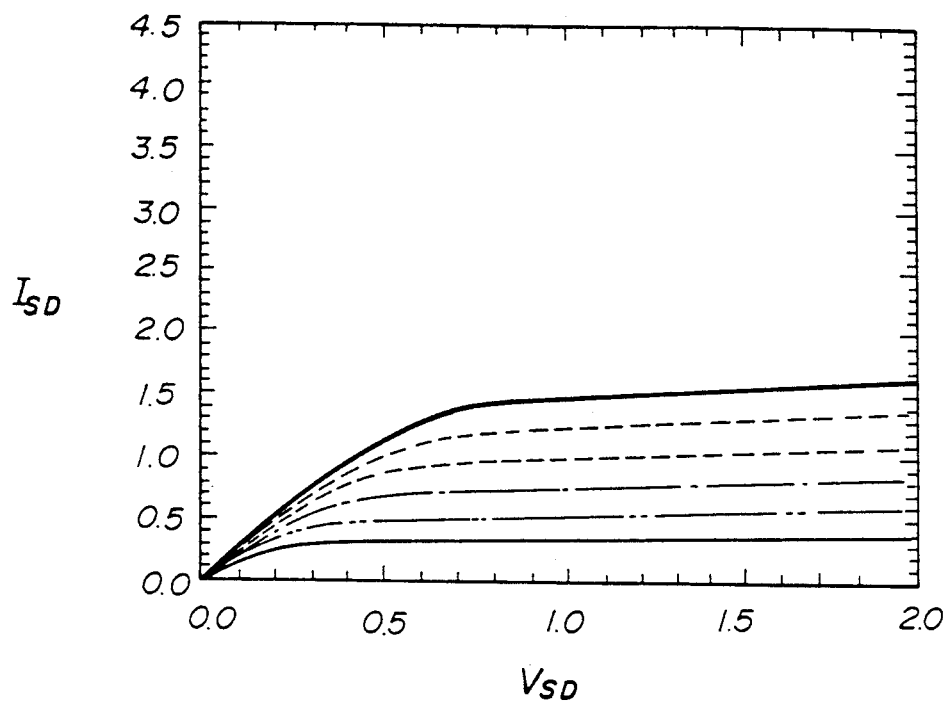
FIG. 12 is a voltage versus current characteristic of the circuit of FIG. 11.
Figure 13:
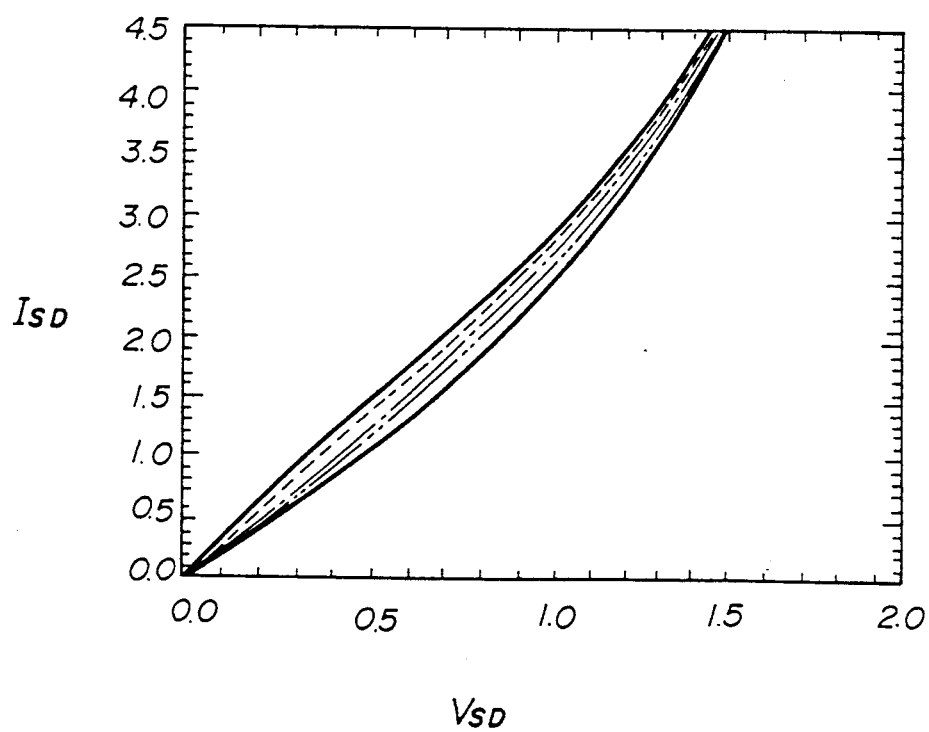
FIG. 13 is the voltage versus current characteristic of the circuit of FIG. 11 under a different condition.

FIG. 13 shows a voltage versus current characteristic of the FETs 53–58 wherein the ordinate represents a source-drain current $I_{SD}$ and the abscissa represents a source-drain voltage $V_{SD}$. As is already described with reference to FIG. 7(A), the transistors 53–58 are connected so as to operate in the linear region and the characteristic curve simulated for the actual FETs is stable against the variation of the threshold voltage. FIG. 12 on the other hand shows, for the purpose of comparison, a hypothetical case in which the FETs 53–58 are connected as shown in FIG. 6(A). As is already noted therein, the FETs thus connected operate in the saturated region and a characteristic similar to FIG. 6(B) is obtained. Note that the variation of the source-drain current for this hypothetical case is several times larger than that for the case of FIG. 11 which corresponds to the connection of FIG. 11. Thus, it is clear that by connecting the FETs 53–58 as shown in FIG. 11, one can significantly reduce the variation of the source-drain current passing through these FETs even there is a variation in the threshold voltage.

Circuit Part 73

As already noted, the circuit part 73 is designed to minimize the change of transfer characteristic responsive to the variation of the enhancement type FETs 59 and 60 and constitutes the essential part of the present invention.

Figure 14:
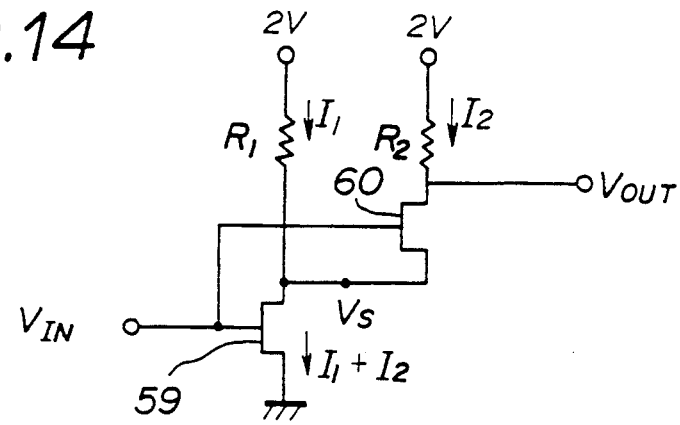
FIG. 14 is a simplified circuit diagram of the circuit of FIG. 11.

First, the operational principle of the circuit part 73 will be described with reference to FIG. 14 which shows the inverter 52 in a simplified form. Thus, the circuit part 71 and the circuit part 72 acting as the load to the FETs 59 and 60 will be represented as resisters $R_1$ and $R_2$. Further, the current flowing through the resister $R_1$ is designated as $I_1$ and the current flowing through the resister $R_2$ will be referred to as $I_2$. For the sake of convenience, the source voltage of −2 volts supplied from the voltage source is replaced by the ground level and the ground level voltage applied to the resisters $R_1$ and $R_2$ is replaced by a voltage of 2 volts.

Figure 15:
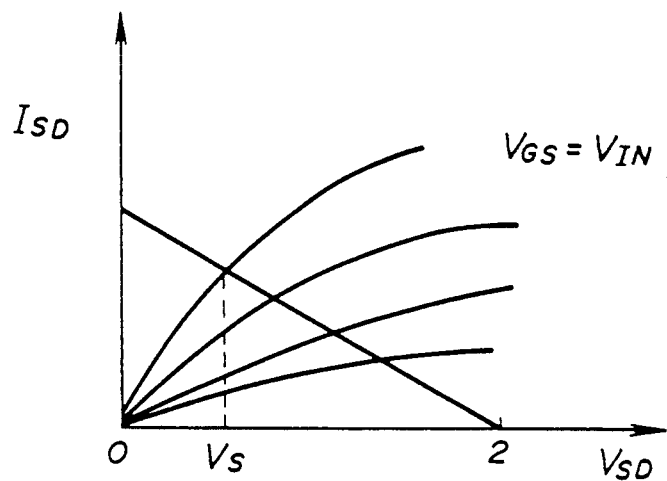
FIG. 15 is a voltage versus current characteristic of an enhancement type field effect transistor used in the circuit of FIG. 11.
Figure 16:
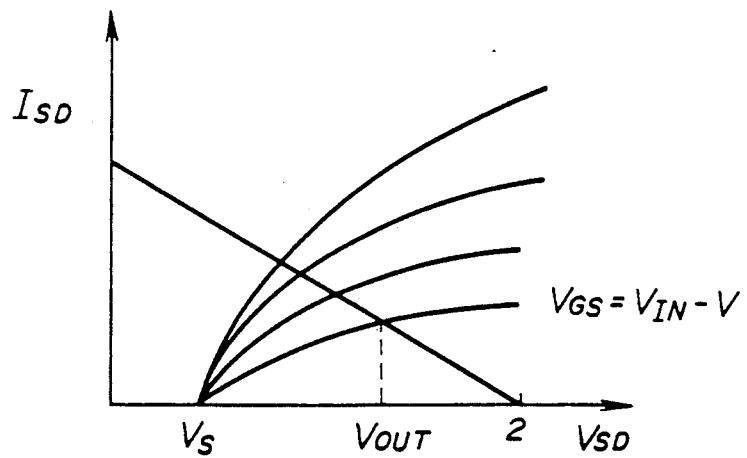
FIG. 16 is a voltage versus current characteristic of another enhancement type field effect transistor used in the circuit of FIG. 11.

FIG. 15 shows the voltage versus current characteristic of the enhancement type FET 59 and FIG. 16 shows the voltage versus current characteristic of the enhancement type FET 60 following the FET 59. In the analysis described below, it is assumed that the characteristic curve of the FET 59 is crossed with a load line in the unsaturated region while the characteristic curve of the FET 60 is crossed with the load line in the saturated region.

Designating the voltage appearing at a node connecting the drain of the FET 59 to the source of the FET 60 as $V_s$, the currents $I_1$, $I_1+I_2$ and $I_2$ are respectively represented by the following equations:

$$I_1 = (2 - V_s)/R \quad (3)$$
$$I_1 + I_2 = 2K[(V_{in} - V_T) - \tfrac{1}{2}V_s]V_s \quad (4)$$
$$I_2 = (2 - V_{out})/R \quad (5)$$
$$I_2 = K[(V_{in} - V_s) - V_T]^2 \quad (6)$$

where $V_{in}$ stands for an input voltage, $V_{out}$ stands for an output voltage of the inverter 52, $V_T$ stands for the threshold voltage of the FETs 59 and 60, and K is a constant.

Note that the current $I_1 + I_2$ given by Eq.(4) is determined by the characteristic of the FET 59, since the currents $I_1$ and $I_2$ both flow through the FET 59. There are two possible operational characteristics for the FET 59, one in the saturated region and the other in the unsaturated region. Eq.(4) is for the operation in the unsaturated region. The current $I_2$ on the other hand flows explicitly through the FET 60 and therefore is determined by the operational characteristic of the FET 60. It is assumed that the FET 60 operates in the saturated region as can be seen from Eq.(6).

Next, a case is considered in which the threshold voltage of the enhancement type FETs 59 and 60 is changed from $V_T$ to $V_T + \Delta V$. Change of the threshold voltage for the depletion type FETs constituting the loads 71 and 72 is not considered here. This situation is equal to a case where an input voltage of $V_{in} + \Delta V$ is applied to the gate of the FETs 59 and 60 instead of applying the input voltage of $V_{in}$. Representing the voltage and current corresponding to $V_s$, $V_{out}$, $I_1$, $I_1 + I_2$ and $I_2$ for this case as $V_s'$, $V_{out}'$, $I_1'$, $I_1' + I_2'$ and $I_2'$ respectively, there hold the following relations:

$$I_1' = (2 - V_s')/R \qquad (7)$$
$$I_1' + I_2' = 2K[(V_{in} - V_T) - \tfrac{1}{2}V_s']V_s' \qquad (8)$$
$$I_1' = (2 - V_{out}')/R \qquad (9)$$
$$I_2' = K[(V_{in} - V_s') - V_T] \qquad (10)$$

In Eq.(8), the term $(V_{in}-V_T)$ is rewritten from an original expression which has a form $[V_{in}+\Delta V-(V_T+\Delta V)]$ wherein the term $\Delta V$ is cancelled out. Similarly, the term $(V_{in}-V_s')$ in Eq.(10) is derived from an original expression $[V_{in}+\Delta V-(V_s'+\Delta V)]$ by cancelling out the term $\Delta V$. Thus, it is clear that each of the equations in Eqs.(3)-(6) has an exactly identical form to the corresponding equation in Eqs.(7)-(10). In other words, the relation between $V_s$ and $V_{out}$ given by Eqs.(3)-(6) is exactly identical to the relation between $V_s'$ and $v_{out}'$ given by Eqs.(7)-(10). Thus, the same $V_s$ and $V_{out}$ can be obtained by applying an input voltage shifted by $\Delta V$ when the threshold voltage $V_T$ is changed by $\Delta V$. The same applies also to the case in which the FET 60 is operated in the unsaturated region.

The foregoing description can be simplified as follows. When the threshold voltage of the FETs 59 and 60 is increased by $\Delta V$ to $V_{th}+\Delta V$, the overdrive of the transistor 59 is reduced which results in an increase of the source-drain current flowing through the FET 59. Responsive thereto, the drain voltage of the FET 59 is decreased. This decrease of the drain voltage in turn results in the decrease of the source voltage of the FET 60 and the threshold characteristic of the inverter to turn the FET 60 on becomes substantially identical to the case where there is no increase in the threshold voltage of the FET 60. In an opposite case where the threshold voltage of the FETs 59 and 60 is decreased by $\Delta V$ to $V_{th}-\Delta V$, the overdrive of the FET 59 is increased which results in an increase of the drain-source current flowing through the FET 59. Associated therewith, the drain voltage of the FET 59 as well as the source voltage of the FET 60 is increased and the threshold characteristic of the inverter 52, viewed form its input side, virtually does not change.

Figure 8:
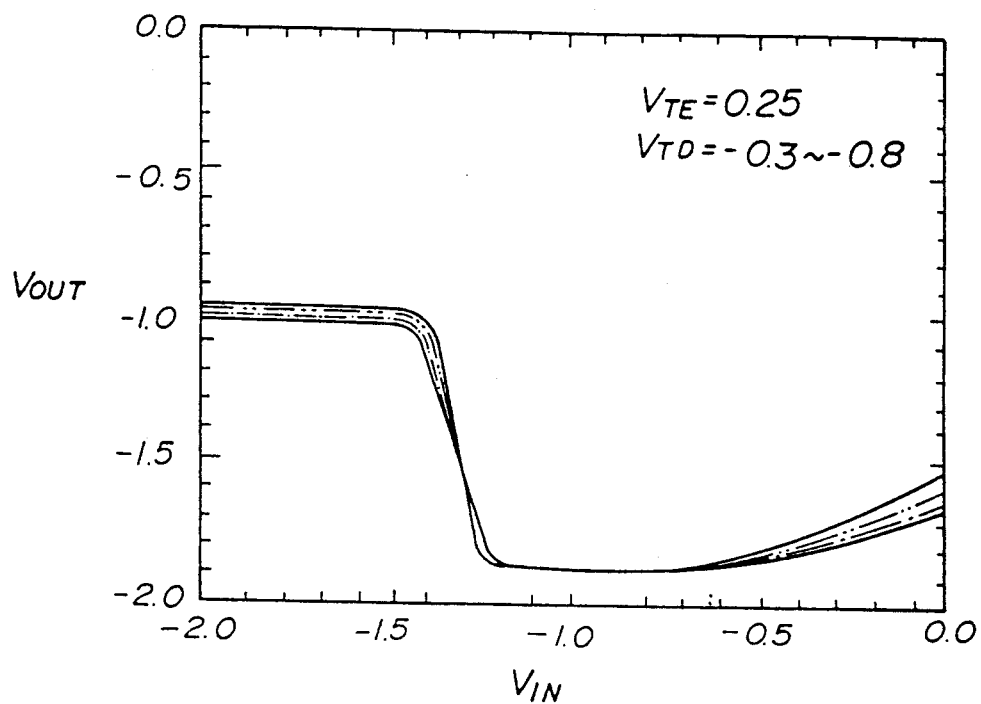
FIG. 8 is a transfer characteristic of the circuit of FIG. 5 in which the threshold voltage of the depletion type field effect transistor is varied.
Figure 17:
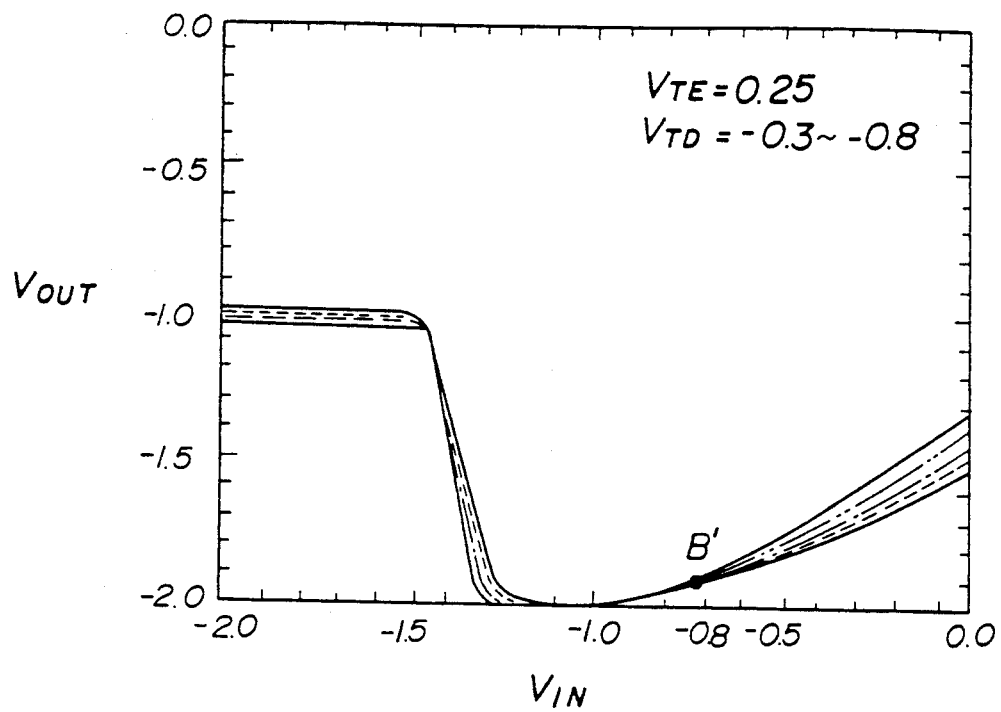
FIG. 17 is a diagram showing a transfer characteristic of the input buffer circuit of FIG. 11 for a case in which the threshold voltage of a depletion type field effect transistor in the circuit is varied.
Figure 18:
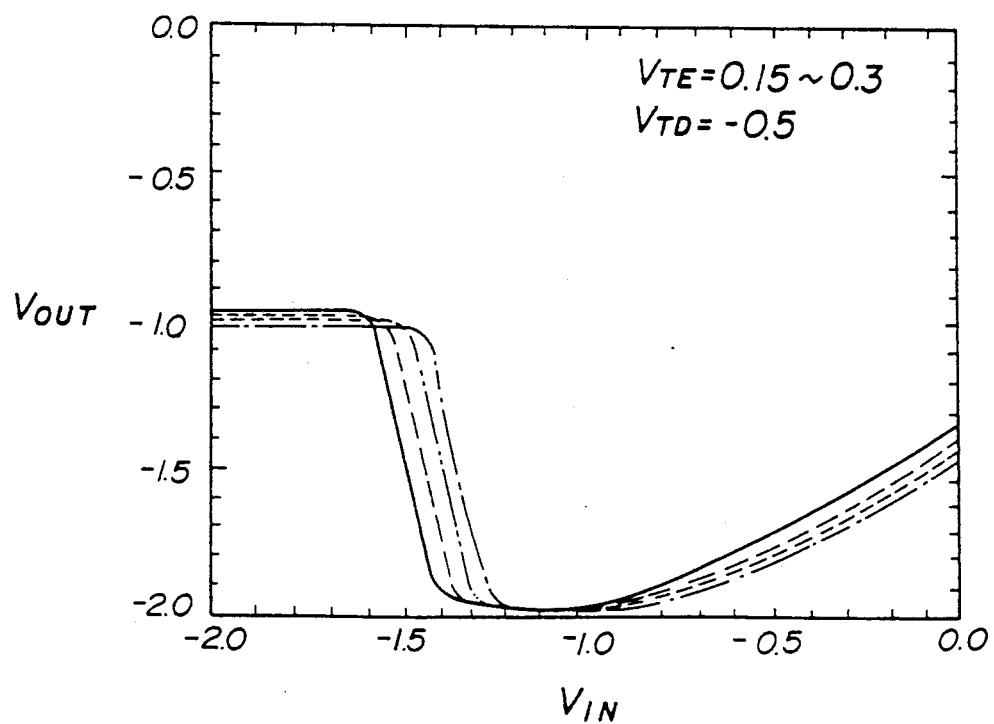
FIG. 18 is a diagram showing a transfer characteristic of the input buffer circuit for a case in which the threshold voltage of an enhancement type field effect transistor is varied.

FIGS. 17 and 18 show the results of a simulation undertaken for the input buffer circuit 51. Referring to FIG. 17 showing the transfer characteristic of the buffer circuit 51 for a case in which the threshold voltage $V_{TD}$ of the FETs 53-58 and also of the FET 30 is changed from $-0.3$ volts to $-0.8$ volts with an interval of 0.1 volt while the threshold voltage $V_{TE}$ of the FETs 59, 60 and 29 is fixed at 0.25 volts, it is clear that the change of the transfer characteristic with the variation in the threshold voltage is minimum similarly to the case of FIG. 8.

Figure 9:
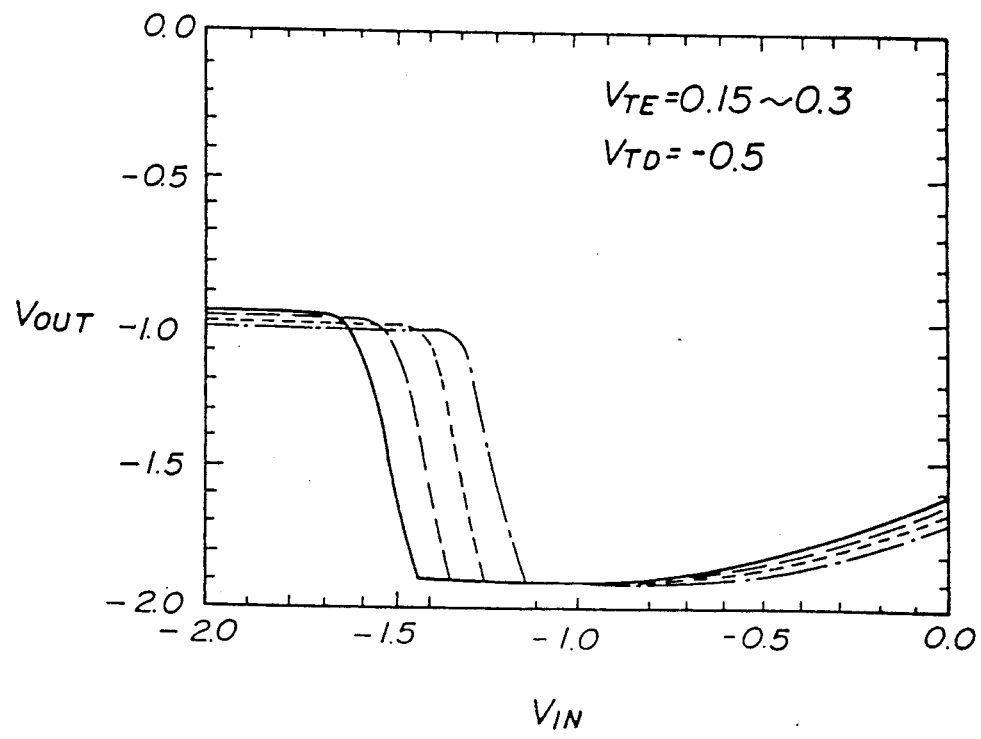
FIG. 9 is a transfer characteristic of the circuit of FIG. 5 for a case in which the threshold voltage of the enhancement type field effect transistor is varied.
Figure 10:
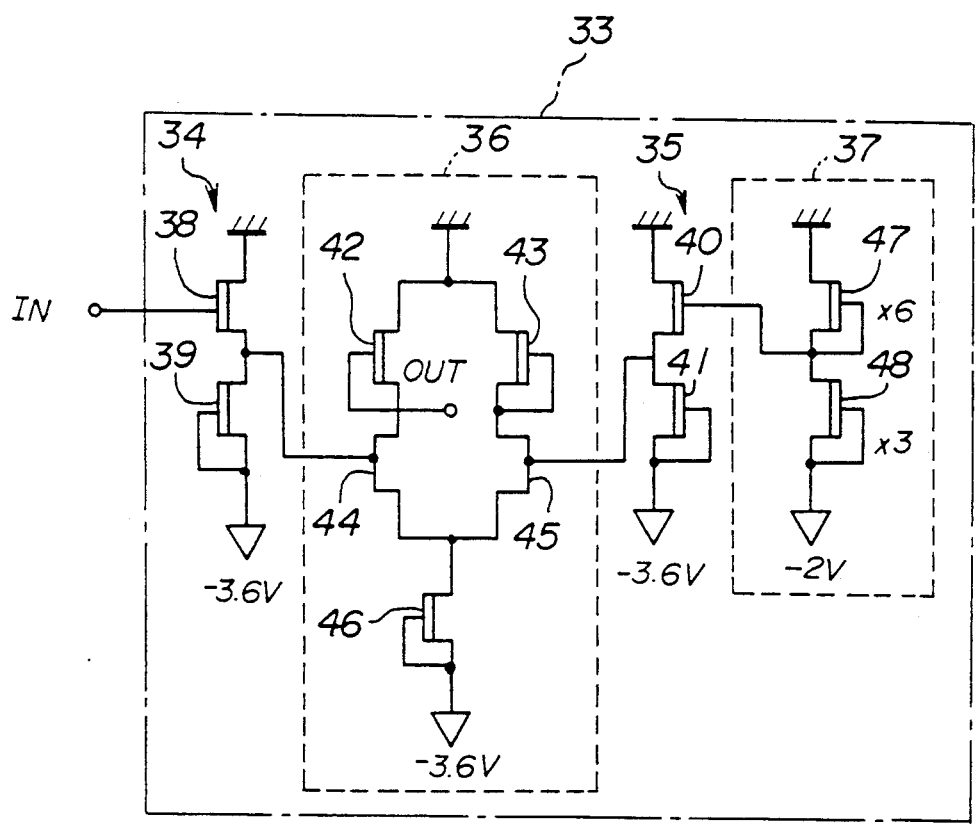
FIG. 10 is a circuit diagram showing another prior art input buffer circuit.

FIG. 18, on the other hand, shows the transfer characteristic of the buffer circuit for a case in which the threshold voltage $V_{TE}$ of the enhancement type FETs 59, 60 and 20 is changed from 0.15 volts to 0.3 volts with an interval of 0.05 volts while the threshold voltage of the FETs 53-58 and also of the FET 30 is fixed at $-0.5$ volts. From FIG. 18, it can be seen that the transfer characteristic shifts to the right by about 0.05 volts responsive to a variation of the threshold voltage $V_{TE}$ amounting to 0.05 volts. From the comparison of FIG. 9 and FIG. 18, it is very clear that the input buffer circuit 51 has the transfer characteristic which changes substantially less in response to the same variation of the threshold voltage of the enhancement type FETs 59, 60 and 30. In the case of the buffer circuit 21 having the transfer characteristic of FIG. 9, the threshold voltage change of $\Delta V$ causes a shift of the characteristic curve which amounts to as much as $2\Delta V$. In the case of the buffer circuit 51 of FIG. 11, on the contrary, the same change of the threshold voltage causes a shift amounting only to $\Delta V$. Generally, change of the threshold voltage by $\Delta V$ in a circuit comprising a pair of FETs connected in series causes a change of the output voltage of $2\Delta V$. In the buffer circuit 51 of FIG. 11, this commonly accepted relation does not hold and the amount of shift of the transfer characteristic in response to the change of the threshold voltage in the enhancement type FETs is reduced to one half, as is represented in Eqs.(3)-(10) and as is supported by FIG. 18.

Further, the input buffer circuit 51 uses the source voltage set to $-2$ volts, and the variation of the threshold voltage caused by the side gate effect is suppressed. Further, the change of the transfer characteristic due to the variation of the threshold voltage of the depletion type FETs used in the circuit parts 71 and 72 can be successfully suppressed as already described with reference to FIG. 17. Thus, the transfer characteristic of the input buffer circuit 51 is stable against the variation of the threshold voltage of both the enhancement type and depletion type FETs. Furthermore, there is an advantage in that the logic threshold level can be set to the desired level relatively easily as the logic level is set by the enhancement type FET.

The input buffer circuit 51 described heretofore is preferred from the reasons set forth before. This circuit 51, however, turns out to have a problem in that the low level in the transfer characteristic is raised when a high level ECL signal, e.g., having a level of $-0.8$ volts, is applied to the input terminal 61. When such a high level ECL signal is applied, a voltage of 1.2 volt appears across the gate and source of the FET 59 and a large current flows through the Schottky gate of the FET 59. In the description hereinafter, a second embodiment of the input buffer circuit of the present invention for eliminating this problem will be described.

Figure 19:
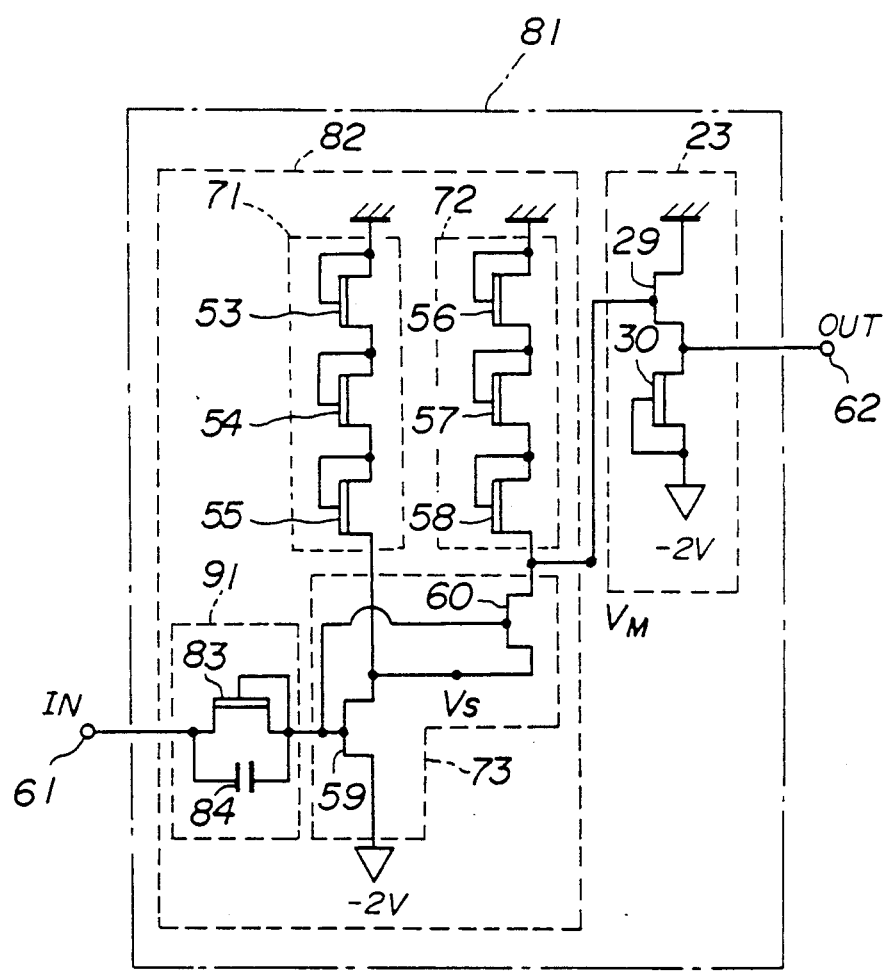
FIG. 19 is a circuit diagram showing a second embodiment of the input buffer circuit of the present invention.

FIG. 19 shows an input buffer circuit 81 which constitutes the second embodiment of the present invention. In FIG. 19, parts which are identical construction to those corresponding parts in FIG. 11 will be given identical reference numerals and the description thereof will be omitted.

Referring to FIG. 19, the input buffer circuit 81 comprises an inverter 82 and a level shift circuit constructed identically to the level shift circuit 23 of FIG. 11. Thus, the level shift circuit will be designated as the circuit 23 and the description thereof will not be repeated. The inverter 82 comprises the depletion type FETs 53-58, another depletion type FET 83, the enhancement type FETs 59 and 60 and a capacitor 84. The FETs 53-58 and the FETs 59 and 60 are connected similarly to the circuit 51 of FIG. 11. Further, the same source voltage is used. Thus, the circuit 81 has a generally similar construction to the circuit 51 and operates similarly.

The circuit 81, however, differs from the circuit 51 in that it has the depletion type FET 83 connected in series between the input terminal 61 and the gate of the FET 59. Thus, the FET 83 has a drain connected to the input terminal 61 and a source connected to the gate of the FET 59. Further, the FET has its gate connected to its source. Furthermore, the capacitor 84 is connected across the source and drain of the FET 83. The FET 83 and the capacitor 84 form a circuit part 91 and the input buffer circuit 81 has a construction such that the circuit part 91 is added to the buffer circuit 51 of FIG. 11. Similarly to other FETs used in the buffer circuit, the FET 83 may be a HEMT device or a GaAs MESFET device.

Before describing the operation of the circuit 81 including the circuit part 91, a description will be given on the problem of the circuit 51 which lacks the circuit part 91 to illuminate the feature of the circuit of the present embodiment.

When a high level ECL signal having the level of −0.8 volts is applied to the input terminal 61 of the buffer circuit 51, there appears a voltage of 1.2 volts across the gate and source of the FET 59. Thereby, the forward voltage or clamp voltage of the Schottky gate is exceeded and a large current flows into the FET 59 through its gate. When such a large current flows through the FET 59 having a resistance designated as Rs, the voltage level at the drain of the FET 59 is raised, with the result that the low level state in the transfer characteristic has a tendency to rise, as illustrated by the point B' in FIG. 17. Further, such a large current increases the load of external driving circuits (not shown) which drive the input buffer circuit. Thus, when such a high level ECL signal is present, it is necessary to limit the current flowing into the FET 59 from the input terminal 61. When the low level state in the region at the right hand side of the point B' of FIG. 17 is suppressed, the difference between the high level and the low level is increased and the operational margin of the buffer circuit is increased.

Figure 20:
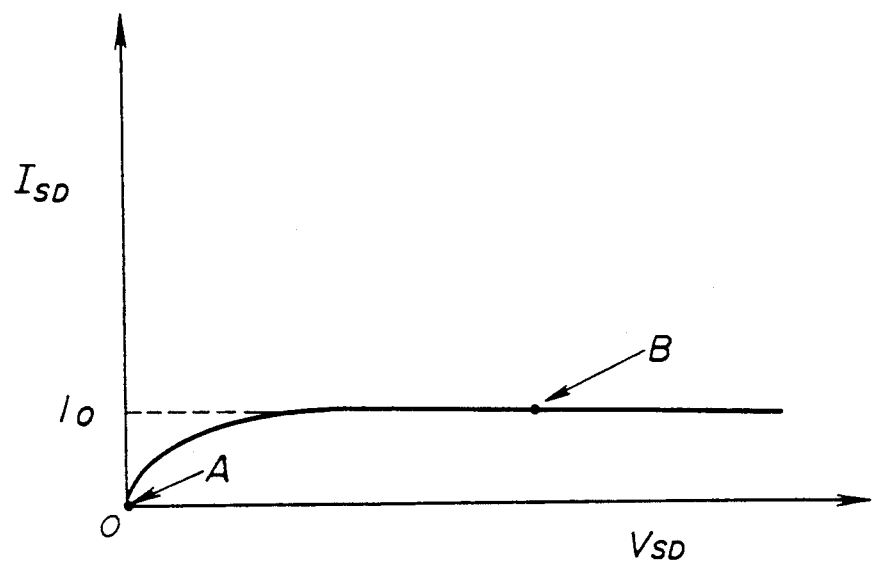
FIG. 20 is a diagram showing a voltage versus current characteristic of a depletion type field effect transistor used in the circuit of FIG. 19.

In the present embodiment, the current supplied to the gate of the FET 59 is limited by the depletion type FET 83 connected to operate in the saturated region. As shown in the voltage versus current characteristic in FIG. 20, the FET 83 acts as a constant current source and the current at the gate of the FET 59 does not exceed a level $I_0$ corresponding to an operational point B shown in FIG. 20 even when there is a large voltage applied across the source and drain through the input terminal 61. Thus, the FET 83 limits the current to the gate of the FET 59 and the unwanted rise of the low level state is successfully eliminated.

Figure 21:
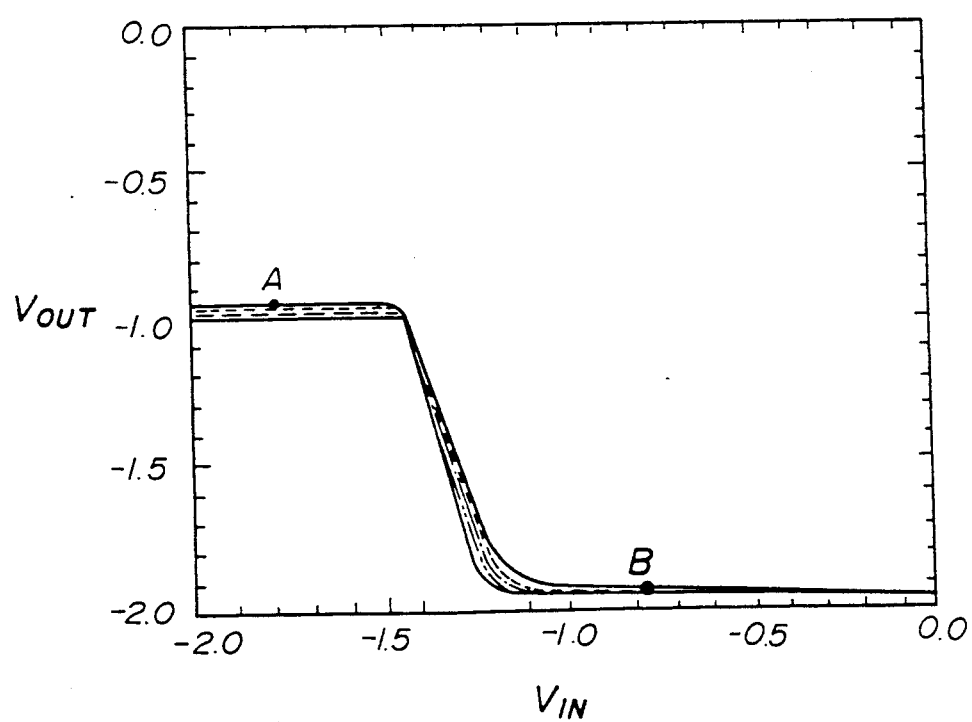
FIG. 21 is a diagram showing a transfer characteristic of the circuit of FIG. 19.

FIG. 21 shows the transfer characteristic of the input buffer circuit 81 having the FET 83 connected in series to the gate of the FET 59 as in FIG. 19. As can be clearly seen from FIG. 21, the level of the point B is definitely lower than that of the point B' in FIG. 17.

Figure 22:
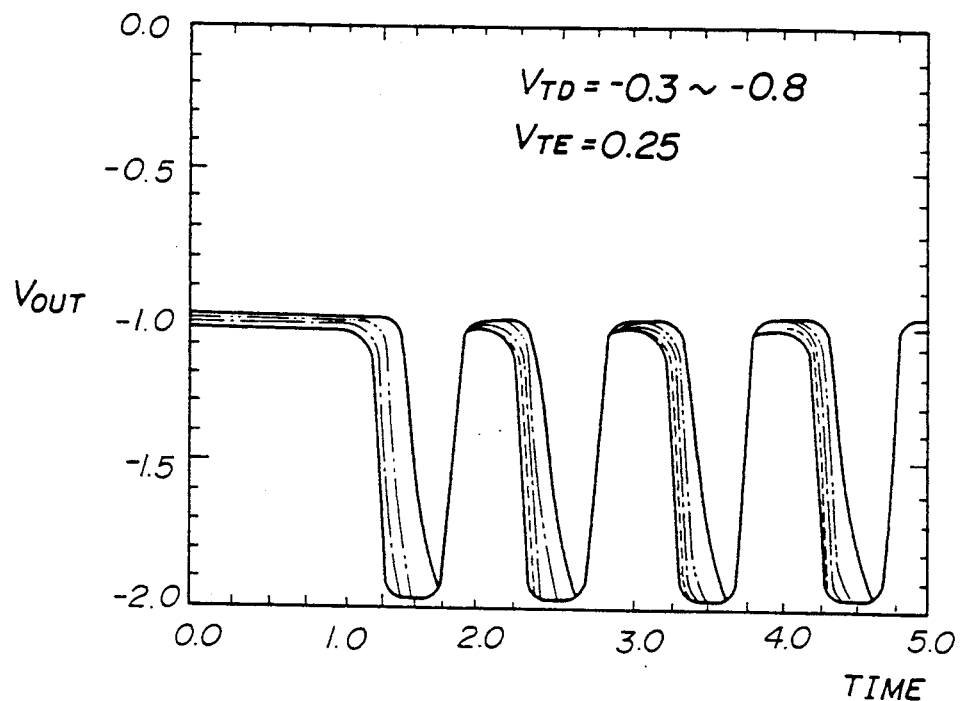
FIG. 22 is a diagram showing a transient characteristic of the circuit of FIG. 19.

This buffer circuit, though provided with the FET 83, encounters a problem when high speed operation is desired, in that there appears a delay in the response of the buffer circuit as the current supplied to the gate of these FETs is limited by the FET 83 and the time needed to charge up the capacitance at the gate of the FETs 59 and 60 is increased. FIG. 22 shows such a response of the circuit 81 to a series of input signals having a rectangular waveform for a case in which the threshold voltage $V_{TD}$ is changed from −0.3 volts to −0.8 volts with an interval of 0.1 volts while fixing the threshold voltage $V_{TE}$ at 0.25 volts. It can be seen from the drawing that there appears a delay in response particularly when the threshold level of the depletion type FETs is changed.

Figure 23:
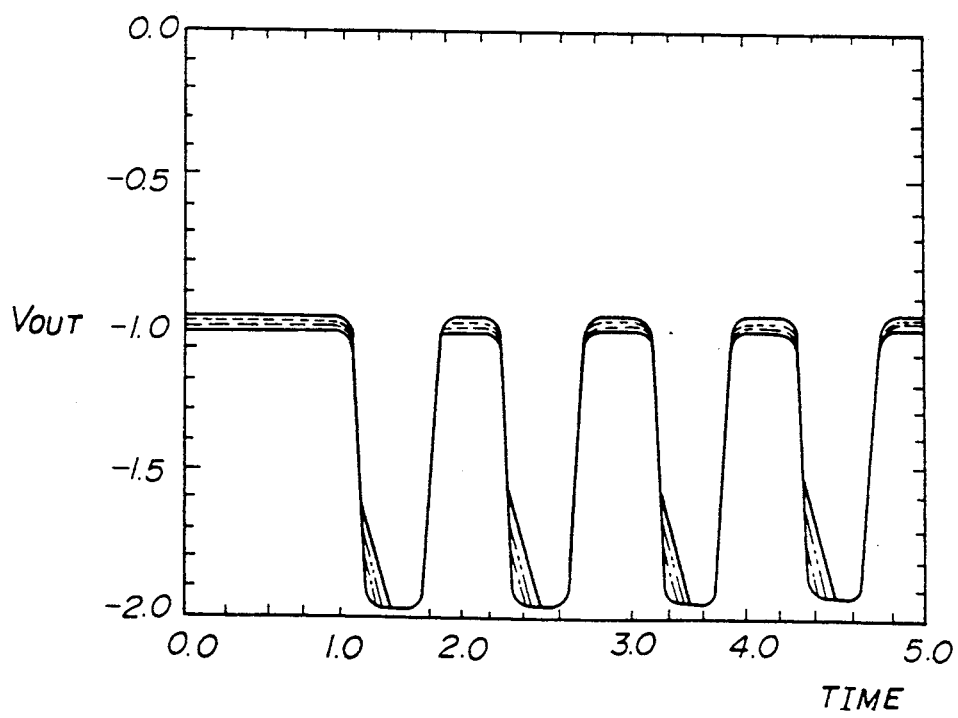
FIG. 23 is a diagram showing another transient characteristic of the circuit of FIG. 19.

In order to improve such a transient characteristic of the buffer circuit 81, the capacitance 84 is provided in parallel to the FET 83 as shown in FIG. 19 so that the high frequency current flows freely through the capacitor 84 and the charge up of the FETs 59 and 60 is accelerated. FIG. 23 shows the transient response of the input buffer circuit 81 which is further provided with the capacitor 84. As can be seen from the drawing, the response of the circuit is significantly improved. Although there remains some delay in the response of FIG. 23, such a delay can be completely eliminated by optimizing the capacitor 84. Of course, any device that provides capacitance can be used for the capacitor 84. For example, the capacitor 84 may be a diode applied with a reversed bias voltage.

Operation

Hereinafter, the operation of the circuit 81 will be described with reference to FIG. 19. When the ECL signal applied to the input terminal 61 has a level lower than the threshold level of the enhancement type FET 59, the FET 59 is turned off and the voltage appearing at a node $V_M$ shown in FIG. 19 is substantially zero. This voltage is shifted by the level shift circuit 23 and supplied to the output terminal 62 as an output signal of the input buffer circuit 81. By setting the level shift circuit 23 such that a voltage of about one volt is obtained as the output voltage in this state, compatibility with the DCFL device is achieved.

When the input voltage is increased, the FET 59 is turned on and the voltage $V_s$ appears at the drain of the FET 59. In this state, the voltage appearing across the gate and source of the enhancement type FET 60 is represented as $V_{in} - V_s$ and thus the FET 60 does not turn on yet. Thus, the voltage at the node $V_M$ is substantially zero and the output voltage of about one volt is obtained from the level shift circuit 23. The operation so far corresponds to a point A shown in FIG. 20.

With a still higher voltage applied to the input terminal 61, both the FET 59 and the FET 60 are turned on and the node $V_M$ assumes a voltage level which is higher than the low level used in the DCFL device by an amount equal to the voltage across the FETs 59 and 60. This voltage at the node $V_M$ is then shifted by the level shift circuit 23 and is converted to the low level of the DCFL device. This operation is represented by the point B in FIG. 21.

In the operational point A, the voltage applied to the FET 83 becomes zero and the transfer characteristic becomes identical to the case in which the FET 83 is not provided. When in the operational point B, however, voltage is applied across the gate and source of the FET 59 and current flows through the FET 59. As the FET 83 is provided, the current flowing in to the gate of the FET 59 is limited as already described and the voltage is divided by the FET 83 and FET 59.

As described heretofore, the input buffer circuit of the present embodiment provides a transfer characteristic which is stabilized against variation of the FETs constituting the circuit and an improved and stable transient characteristic. Further, the low level state in the transfer characteristic is lowered and the operational margin of the circuit is extended. Furthermore, the load of circuits supplying the input signal to the buffer circuit is also reduced.

Further, the present invention is not limited to these embodiments but various variations and modifications may be made without departing from the scope of the invention.

What is claimed is:

1. An input buffer circuit for converting the logic level of an input logic signal, comprising:
   an input terminal to which said input signal is applied,
   an output terminal;

an inversion circuit supplied with the input logic signal for inverting the logic level thereof, said inversion circuit comprising:
- a first voltage source for supplying a first predetermined voltage,
- a second voltage source for supplying a second predetermined voltage having a level lower than that of said first predetermined voltage,
- first resistance means having a first end connected to the first voltage source and a second end,
- a first enhancement type field effect transistor having a drain connected to the second end of the first resistance means, a source connected to said second voltage source and a gate connected to said input terminal,
- second resistance means having a first end connected to the first voltage source and a second end, and
- a second enhancement type field effect transistor having a drain connected to the second end of the second resistance means, a source connected to the drain of said first enhancement type field effect transistor and a gate connected to the gate of the first enhancement type field effect transistor; and level shift means, connected between the drain of the second enhancement type field effect transistor of said inversion circuit and the output terminal, for shifting the level of the signal produced at the drain of the second enhancement type field effect transistor and thereby producing and supplying to the output terminal an output logic signal having a converted logic level, relative to the input signal.

2. An input buffer circuit as claimed in claim 1 in which each of said first and second resistance means comprises a serial connection of depletion type field effect transistors and wherein, as to each of the depletion type field effect transistors, the source and drain thereof are interconnected.

3. An input buffer circuit as claimed in claim 2 in which each of said first and second resistance means comprises three Schottky gate field effect transistor.

4. An input buffer circuit as claimed in claim 1 in which the level of said second predetermined voltage is lower than the level of said first predetermined voltage by about 2 volts.

5. An input buffer circuit as claimed in claim 1 further comprising limiting means, connected between the input terminal and the gate of the first enhancement type field effect transistor, for limiting the current conducted therethrough to a predetermined level.

6. An input buffer circuit as claimed in claim 5 in which said current limiting means comprises a depletion type field effect transistor having a drain connected to the input terminal, a source connected to the gate of the first enhancement type field effect transistor and a gate connected to the source of the depletion type field effect transistor, and a capacitor connected across the drain and source of the depletion type field effect transistor.

7. An input buffer circuit as claimed in claim 1 wherein said level shift circuit comprises a third enhancement type field effect transistor and a depletion type field effect transistor effect transistor having a drain connected to the first voltage source, a gate connected to the drain of the second enhancement type field effect transistor and a source connected to the drain of the depletion type field effect transistor, and said depletion type field effect transistor having a source and a gate connected in common to the second voltage source.

* * * * *

UNITED STATES PATENT AND TRADEMARK OFFICE
CERTIFICATE OF CORRECTION

PATENT NO. : 5,051,626

DATED : September 24, 1991

INVENTOR(S) : Kiyoshi KAJII

It is certified that error appears in the above-identified patent and that said Letters Patent is hereby corrected as shown below:

Col. 2,    line 11,   after "connected" insert --to--.

Col. 4,    line 5,    after "connected" insert --to--;
            line 17,   change "volt" to --volts--;
            line 33,   after "connected" insert --to--.

Col. 5,    line 19,   change "an" to --a--.

Col. 7,    line 20,   after "voltage" insert --in--.

Col. 9,    line 20,   change "load" to --loads--;
            line 37,   change "part" to --parts--;
            line 43,   after "together" delete "each other in".

Col. 10,   line 3,    after "even" insert --if--;
            line 15,   change "resisters" to --resistors--;
            line 17,   change "resister" to --resistor--;
            line 18,   change "resister" to --resistor--;
            line 22,   change "resisters" to --resistors--.

Col. 11,   line 16,   change "$v_{out}'$" to --$V_{out}'$--;
            line 40,   change "form" to --from--.

Col. 12,   line 34,   change "volt" to --volts--;
            line 42,   after "identical" insert --in--.

UNITED STATES PATENT AND TRADEMARK OFFICE
CERTIFICATE OF CORRECTION

PATENT NO. : 5,051,626

DATED : September 24, 1991

INVENTOR(S) : Kiyoshi KAJII

It is certified that error appears in the above-identified patent and that said Letters Patent is hereby corrected as shown below:

Col. 16, line 6, change "transistor" to --transistors--.

Signed and Sealed this

Twelfth Day of October, 1993

Attest:

*Attesting Officer*

BRUCE LEHMAN

*Commissioner of Patents and Trademarks*